(12) United States Patent
Ledieu et al.

(10) Patent No.: US 7,919,961 B2
(45) Date of Patent: Apr. 5, 2011

(54) METHOD FOR MEASURING MAGNETIC PERMEABILITY AND REFERENCE SAMPLE USED IN THE LATTER

(75) Inventors: Marc Ledieu, Ballan Mire (FR); Olivier Acher, Monts (FR)

(73) Assignee: Commissariat a l'Energie Atomique, Paris (FR)

( * ) Notice: Subject to any disclaimer, the term of this patent is extended or adjusted under 35 U.S.C. 154(b) by 535 days.

(21) Appl. No.: 12/084,016

(22) PCT Filed: Oct. 20, 2006

(86) PCT No.: PCT/EP2006/067601
§ 371 (c)(1),
(2), (4) Date: Apr. 22, 2008

(87) PCT Pub. No.: WO2007/048752
PCT Pub. Date: May 3, 2007

(65) Prior Publication Data
US 2009/0102458 A1 Apr. 23, 2009

(30) Foreign Application Priority Data
Oct. 24, 2005 (FR) ..................... 05 53223

(51) Int. Cl.
*G01N 27/72* (2006.01)
*G01R 33/12* (2006.01)
(52) U.S. Cl. ......... 324/228; 324/202; 324/249; 324/260
(58) Field of Classification Search .......... None
See application file for complete search history.

(56) References Cited

U.S. PATENT DOCUMENTS
2,331,418 A * 10/1943 Nolde ..................... 324/243
(Continued)

FOREIGN PATENT DOCUMENTS
FR 2699683 6/1994
FR 2822957 4/2002

OTHER PUBLICATIONS
Acher, O. et al., "Permeability Measurement on Ferromagnetic Thin Films from 50 MHz up to 18 GHz," Journal of Magnetism and Magnetic Materials 136 (1994), pp. 269-278.

(Continued)

*Primary Examiner* — Jay M Patidar
(74) *Attorney, Agent, or Firm* — Nixon Peabody LLP

(57) ABSTRACT

The invention relates to a method for measuring the magnetic permeability of a magnetic material by measuring the magnetic interaction of an electromagnetic field with this material by using a measuring device including a measuring cell connected through a microwave frequency cable (13) to a vector network analyser (12), said method comprising steps for gauging/calibrating said measuring device, for determining corrective coefficients to be applied to the measurements obtained by means of this device, for verifying the non-drift of this device, these steps being carried out with the help of a reference sample, wherein a reference sample is used, comprising at least one inclusion which enables creation, in a given volume, of a local artificial permeability, each inclusion being achieved by combining at least one inductive component possibly associated with a combination of at last one capacitive and/or resistive and/or active component, the frequency response of the electromagnetic properties of each volume being adjusted by the value and the assembly architecture of the components.

The invention also relates to such a reference sample.

14 Claims, 4 Drawing Sheets

U.S. PATENT DOCUMENTS

| | | | |
|---|---|---|---|
| 4,079,312 A * | 3/1978 | Osborn et al. | 324/226 |
| 5,103,173 A | 4/1992 | Honkura et al. | |
| 5,744,972 A | 4/1998 | Korenivski et al. | |
| 6,351,119 B1 | 2/2002 | Kawase | |
| 6,677,762 B1 * | 1/2004 | Adenot et al. | 324/637 |
| 2004/0021463 A1 * | 2/2004 | Miyazawa et al. | 324/252 |

OTHER PUBLICATIONS

Adenot, A.L. et al., "Broadband Permeability Measurement of Ferrormagnetic Thin Films or Microwires by a Coaxial Line Perturbation Method," Journal of Applied Physics, vol. 87, No. 9, May 1, 2000, pp. 5965-5967.

Drake, A.E. et al., "Reference Materials for Calibrating Magnetic Permeability Measuring Equipment," IEEE Transaction on Magnetics, vol. 26, No. 5, Sep. 1990, 1 page.

Fessant, A. et al., "A Broad-Band Method for Measuring the Complex Permeability of Thin Soft Magnetic Films," Journal of Magnetism and Magnetic Materials 133 (1994), pp. 413-415.

Jacquart, P. M. et al., "Influence of the Electrical Resistivity of a Ferromagnetic Thin Film on its Permeability Measurement Performed with a Permeameter," Journal of Magnetism and Magnetic Materials 281 (2004), pp. 82-91.

Ledieu, M. et al., "New Achievements in High-Frequency Permeability Measurements of Magnetic Materials," Journal of Magnetism and Magnetic Materials 258-259 (2003), pp. 144-150.

Pain, D. et al., "An Improved Permeameter for Thin Film Measurements up to 6 GHz," Journal of Applied Physics, vol. 85, No. 8, Apr. 15, 1999, pp. 5151-5153.

Senda, M. et al., "Permeability Measurement in the GHz Range for Soft-Magnetic Film using the M/C/M Inductance-Line," IEEE Transactions on Magnetics, vol. 31, No. 2, Mar. 1995, pp. 960-965.

Senda, M. et al., "Permeability Measurement of Soft Magnetic Films at High Frequency and Multilayering Effect," IEEE Translation Journal on Magnetics in Japan, vol. 8, No. 3, Mar. 1993, pp. 161-168.

Yamaguchi, M. et al., "Cross Measurements of Thin-Film Permeability up to UHF Range," Journal of Magnetism and Magnetic Materials 242-245 (2002), pp. 970-972.

* cited by examiner

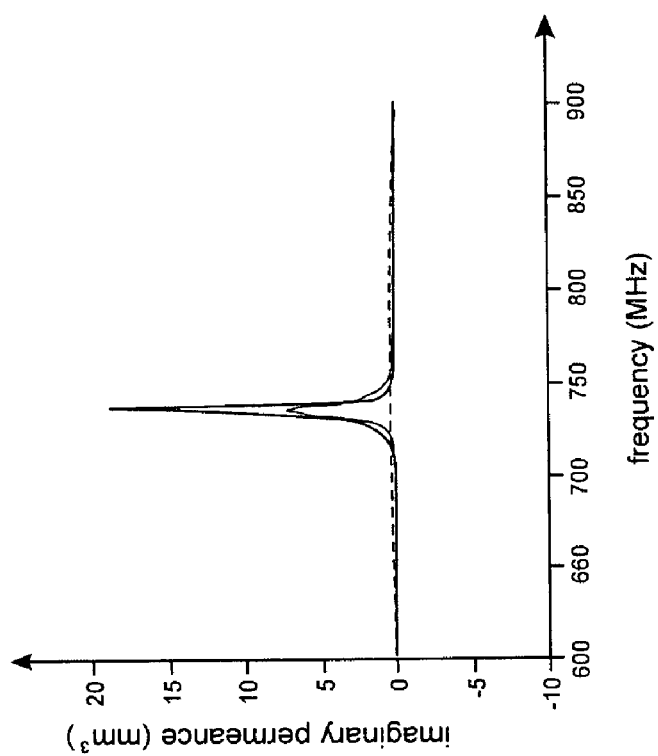
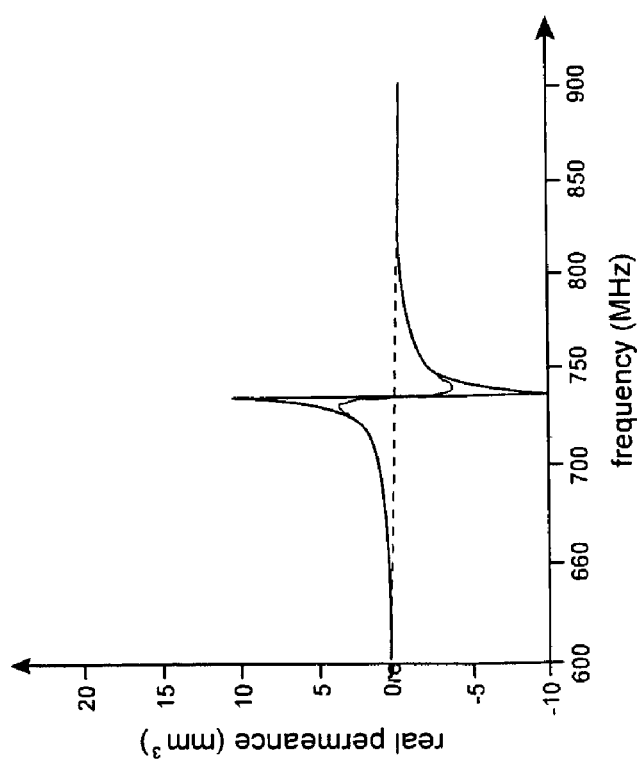

METHOD FOR MEASURING MAGNETIC PERMEABILITY AND REFERENCE SAMPLE USED IN THE LATTER

CROSS REFERENCE TO RELATED APPLICATIONS OR PRIORITY CLAIM

This application is a national phase of International Application No. PCT/EP2006/067601 entitled "METHOD FOR MEASURING MAGNETIC PERMEABILITY AND REFERENCE SAMPLE USED IN THE LATTER", which was filed on Oct. 20, 2006, and which claims priority of French Patent Application No. 05 53223, filed Oct. 24, 2005.

TECHNICAL FIELD

The invention relates to a method for measuring magnetic permeability and to a magnetic reference sample in the latter.

STATE OF THE PRIOR ART

Knowledge of the electromagnetic properties of materials (dielectric permittivity and magnetic permeability) is of high interest notably because of increasingly faster developments in the field of telecommunications. These materials are indeed integrated into a large number of systems (antennas, filters, etc.) or electronic components (inductors, transmission lines, etc.) the performances of which depend on the properties of the materials used in frequency ranges located from DC to several tens of GHz.

In order to characterise the electromagnetic properties of a material, whether this be in a guided structure or in free space, the interaction of an electromagnetic field with this material is measured. By modelling or analytical calculation, it is then possible to trace back the spectra of electromagnetic properties of the material (dielectric permittivity and magnetic permeability). This material may be prepared as a sample adapted to a characterisation technique, or characterised in its environment of use (non-destructive testing for example).

Techniques for microwave frequency characterisation of a material may be grouped in three large categories:

time-domain techniques based on Fourier spectrum analysis of the interaction of an ultrashort pulse with the material;

absolute harmonic techniques; no calibration coefficient is required for calculating spectra of properties from measurements of the wave/material interaction;

non-absolute harmonic techniques: a corrective coefficient is required for adjusting the calculation and finally having values of absolute radioelectric properties, an example by single coil perturbation being thereby described in the document referenced [1] at the end of the description.

In terms of metrology, three aspects have to be taken into account:

gauging/calibration of the measurement instrumentation (valid regardless of the technique used);

determination of the corrective coefficients for calculating the absolute properties of a material, in the case of non-absolute harmonic techniques;

verification of the non-drift of an instrumentation or for validity of the associated calculation chain (valid regardless of the technique used).

When a vector network analyser is used, which enables measurement of the interaction of a material with an electromagnetic wave by quantifying the transmission and reflection of the latter through or on the sample used, in order to calibrate the latter, a comparison is conventionally performed with a device connected to a time and frequency standard.

This analyser is then calibrated in order to compensate for the different sources of errors in the measurement of the transmission and reflection parameters of the waves, by using known loads (reference impedances). A calculation enables the determination of correction coefficients to be systematically applied to the measurements. These known loads may be passive and mechanical elements or electronic devices which will automatically present different loads to the analyser.

It may also be necessary to determine corrective coefficients for calculating absolute levels of properties of the samples and to verify the non-drift of the performances of the devices. These steps, for dielectric properties (permittivity) are traditionally performed by means of reference permittivity materials, for example oxide ceramics, in order to produce different permittivities. So-called reference samples are then made which are used for determining the corrective coefficients or for checking that the instrumentation actually delivers the values which are expected. In the case of low permittivity values, polymers (example: Plexiglas of permittivity $\epsilon \approx 2.72$) may be used. These polymers are less satisfactory in terms of stability over time and in temperature, with a low glass transition temperature, often below 100° C. Intercomparison circuits, set up in parallel, allow the permittivity values of materials used as a reference to be determined.

In the case of characterisation of magnetic materials, ferrite reference samples may be used. With a stable geometry over time (ceramic), these magnetic samples are nevertheless very sensitive to the external magnetic field and sensitive to temperature changes. In the field of characterisation of thin ferromagnetic layers, intercomparisons on samples have been carried out, for example in comparative measurements, such as those described in the referenced document [2].

The samples may be cut out again so as to be able to adapt to various characterisation techniques. This causes changes in their size and in their response to the electromagnetic field (static and dynamic demagnetising effects). With thin layers of large dimension, the characterisation devices use localised fields. The surface of these layers is then no longer excited homogeneously and their apparent properties are changed by this. Magnetic materials moreover present a magnetic hysteresis that does not enable, a priori, the magnetic state and therefore the permeability spectrum of a material to be guaranteed. This imposes strict observation of the procedures for magnetically conditioning the sample in order to have a reference at one's disposal.

Reliable reference samples are not available today which at the very least allow the metrological verifications mentioned earlier.

The referenced document [1] describes a system for measuring permeability consisting of a measuring cell, which is a single coil, associated with a vector network analyser which enables measurement of the impedance of the measuring cell. By a mathematical treatment, it is possible to calculate the permeability spectrum from the difference in impedance measured with and without the magnetic material in the measuring cell. To carry out the calculation, three pieces of information are available: the modelling parameters of the measuring cell, a corrective coefficient K and the volume of magnetic material introduced into the cell. The parameters of the cell are obtained from measuring the latter by means of the analyser. The volume of magnetic material is inputted by the operator. The coefficient K is obtained by measuring a known magnetic sample and by adjusting this coefficient K in order to make both experimental data and reference values coincide.

The referenced document [2] describes the compared measurement of the permeability of thin layers right up to the range of UHF frequencies. This document shows that the procedure for validating the measurements is a cumbersome procedure.

The technical problem of determining the value of the corrective coefficient K and of its verification over time is posed in both of these documents. The permeability of a magnetic material depends on the electromagnetic environment, on the applied stress, on the temperature, on the oxidation, etc. The magnetic material should therefore be used with a lot of precaution as a reference and its stability over time is not ensured.

The object of the invention is to propose a method for measuring magnetic permeability and a reference sample used in the latter which enables this system to be adjusted and verified.

DISCUSSION OF THE INVENTION

The invention relates to a method for measuring magnetic permeability of a magnetic material by measuring the magnetic interaction of an electromagnetic field with this material by using a measuring device including a measuring cell connected through a microwave frequency cable to a vector network analyser, said method comprising steps for:

gauging/calibrating said measuring device, determining corrective coefficients to be applied to the measurements obtained by means of this device, verifying the non-drift of this device, these steps being performed with the help of a reference sample, characterised in that a reference sample is used, comprising at least one inclusion which enables creation, in a given volume, of a local artificial permeability, each inclusion being achieved by combining at least one inductive component possibly associated with a combination of at least one capacitive and/or resistive and/or active component, the frequency response of the electromagnetic properties of each volume being adjusted by the value and the assembly architecture of the components.

The invention also relates to a permeability reference sample capable of being used for:

gauging/calibrating a device for measuring the magnetic permeability of a magnetic material by measuring the magnetic interaction of an electromagnetic field with this material, this measuring device including a measuring cell connected through a microwave frequency cable to a vector network analyser, determining corrective coefficients to be applied to the measurements obtained by means of this device, verifying the non-drift of this device, characterised in that it comprises at least one inclusion which enables creation, in a given volume, of a local artificial permeability, each inclusion being achieved by combining at least one inductive component possibly associated with a combination of at least one capacitive and/or resistive and/or active component, the frequency response of the electromagnetic properties of each volume being adjusted by the value and the assembly architecture of the components.

Advantageously, the reference sample includes at least one component containing a magnetic material.

Advantageously, the value of at least one component of at least one inclusion is remotely adjustable. At least one component comprises elements with an electric function.

In the case when the inductive component comprises a magnetic core, it will be preferred that the value be rather given by its geometrical characteristics than by the value of the intrinsic permeability of the core, by the well-known principle of air gap cores.

Advantageously, the components of at least one inclusion are embedded in a dielectric filler material. It is also the whole of the inclusions which may be maintained in shape by a dielectric filler material. With this, repeatable and easy positioning may be achieved in a measuring cell.

Advantageously, the reference sample has a reference magnetic function in an electromagnetic field direction, and a non-magnetic dielectric function in another direction.

Advantageously, a reference magnetic function value which may, for example, be permeability, permeance, or an integral value of the frequency permeability may be associated with the sample.

SHORT DESCRIPTION OF THE DRAWINGS

FIGS. 3, 4, 5A and 5B illustrate permeance spectra obtained on reference samples from three components R, L and C in parallel.

DETAILED DISCUSSION OF PARTICULAR EMBODIMENTS

Figure 1:
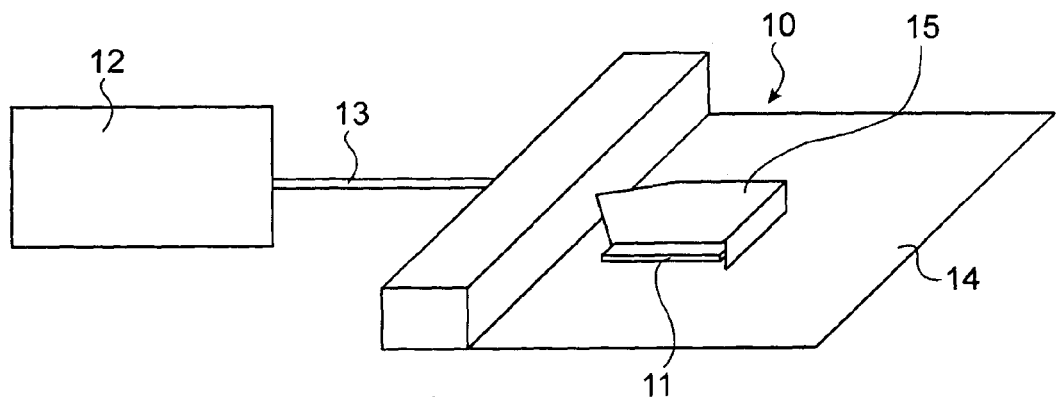
FIG. 1 illustrates a device applying the method for measuring magnetic permeability of the invention.

A device applying the permeability measurement method of the invention, illustrated in FIG. 1, is a single coil perturbation device in an example of instrumentation for measuring permeability.

This device comprises:

a measuring cell 10 capable of receiving a magnetic sample 11 according to the invention, a vector network analyser 12, for example of the HP8753ES type, connected to each other through a microwave frequency cable 13.

The measuring cell 10 comprises an earth plane 14, associated with a measuring single coil 15.

In this device for measuring permeability, a sample associated with a permeance or permeability value which should be again found by adjusting the corrective coefficient K, is used. The use of this sample according to the invention provides a guarantee on the measurement stability, this sample being well characterised by the value which is associated with it regardless of the measurement environment conditions.

The sample of the invention is a permeability reference sample comprising at least one inclusion which enables creation, in a given volume, of a local artificial permeability. Each inclusion is achieved by combining at least one inductive component, possibly associated with a combination of at least one capacitive and/or resistive and/or active component. The frequency response of the electromagnetic properties of each volume is once and for all adjusted by the value and the assembly architecture of the components.

Figure 2:
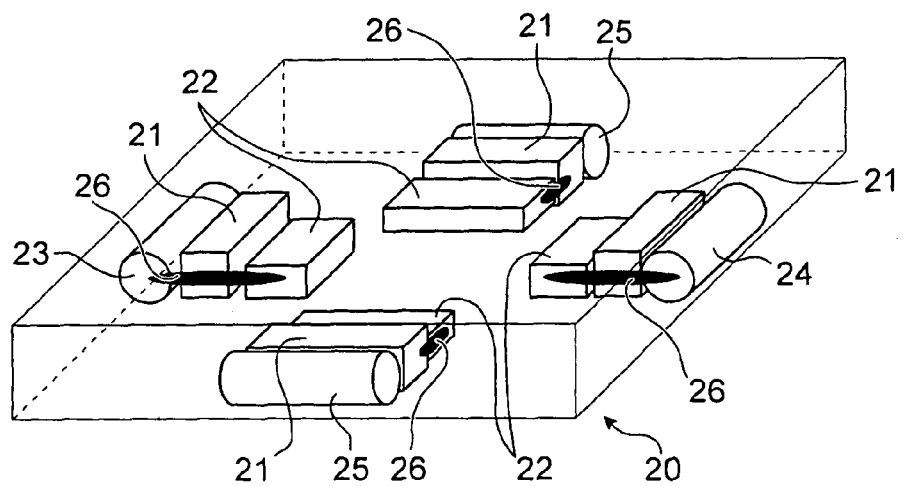
FIG. 2 illustrates an exemplary embodiment of the reference sample of the invention.

FIG. 2 illustrates an exemplary embodiment of the reference sample according to the invention capable of being used in the measurement system illustrated in FIG. 1.

This sample 20 comprises the following components:
capacitors 21, for example of 0.5 pF,
resistors 22, for example of 4.7 kΩ,
solenoid inductors 23, for example of 47 nH,
solenoid inductors 24, for example of 10 nH,
unconnected solenoid inductors 25, for example of 47 nH and 10 nH,
some of these components being welded in parallel through connections 26.

The whole of these components is embedded in a block of resin 30, for example of 9×9×0.5 mm³.

The permeability of the sample of the invention may be made variable. In this case, without perturbing the measurement system, an adjustable reference sample is obtained by remotely varying the value of one or more components of the inclusion.

In a pre-characterisation step, the apparent permeance (product of the permeability by the relevant volume) of the reference sample is once and for all measured by means of a moreover validated characterisation device.

The properties of the sample, for example its permeance, are stable over time and allow subsequent characterisations to be validated. They also allow the calibration of the instrumentation to be verified by measuring a known sample under real conditions, and/or the non-drift of the instrumentation, and/or the validity of the chain for calculating the properties of the material.

From the permeance, integral values (for example the integral over the frequency of the permeance divided by the frequency, or the integral over the frequency of the permeance multiplied by the frequency) may be calculated, which may be associated with the reference sample. The use of these integral values makes the reference sample less sensitive to making or characterisation contingencies, and therefore even better adapted for forming a reference.

The stability of the properties of each inclusion over time is achieved by verifying the stability over time of the components of this inclusion.

Using dedicated components for the electronics and of small dimensions, enables small size reference samples to be made which may be easily inserted into the measuring devices.

By using elements with an electric function, for example copper wires, capacitors, it is moreover possible:
to ensure insensitivity to the magnetic field of the created permeability spectrum;
to limit the drifts of properties by suppressing oxidation and ageing effects often specific to conventional magnetic materials;
to limit the uncontrolled temperature drifts in the case of conventional magnetic materials.

The reference sample of the invention differs from metamaterials, wherein the inclusions consist of an inductive element, providing magnetic coupling with an external field, and of a load connected to this inductive element. These metamaterials contain RLC components and are characterised in terms of permeability (homogenised property). Indeed in the sample of the invention, the latter is associated with another property which is permeance, which is quasi independent of the characterisation cell. It also differs from metamaterials by the fact that it is positioned relatively to the characterisation means (in the measuring line or cell, etc.). The inclusion(s) which make it up, should be positioned in the measuring cell reproducibly. Any mechanical, passive or active positioning means may be associated with the inclusion, enabling definition of a volume, in which permeance is expressed, which may be reproducibly positioned in the characterisation means. Finally, in the case of the reference sample of the invention interest is shown in permeance, which is a local property.

In addition, the conformation of each volume corresponding to an inclusion may easily be ensured by either using a dielectric filler material or not. Thus, the inclusion may not fill the whole of the corresponding volume. It is generally sought to obtain sizes of inclusions which are small relatively to the characterisation cell for which the reference sample is intended, for example by using an inductive pattern (for example two to ten times smaller).

With a suitable geometry of inclusions, the reference sample according to the invention may have a reference magnetic function in one electromagnetic field direction (polarisation) and a non-magnetic dielectric function in another direction. This allows a reference measurement to be carried out with a same sample in the case of a technique for differential characterisation of permeability: in one direction, only the dielectric effects are measured and in the other direction the dielectric and magnetic effects are measured. By differentiation, the magnetic effects may then be obtained.

The reference sample of the invention differs from the calibration devices of conventional network analysers. Indeed, these devices use the physical connection of an electronic load impedance to the transmission line, the coupling of this impedance therefore being a coupling by conduction. On the other hand, in the case of the reference sample of the invention, the coupling is a coupling by radiation without any connection between the reference sample and the characterisation structure, including in a transmission line.

Exemplary Embodiment of a Reference Sample

A technique for characterising thin ferromagnetic layers by the perturbation from a single coil is described in the referenced document [1]. This technique enables determination of the magnetic permeability spectrum of a thin layer as a centimetric sample. It is based on a double measurement which will enable the change in impedance of a single coil to be known which will be loaded by the magnetic thin layer to be characterised. By a calculation, it is then possible to obtain the microwave frequency permeability of the thin layer.

In order to produce a reference sample in a small volume, a resonant parallel RLC circuit is used. The inductance L acts as a magnetic coupling component with the electromagnetic field incident on the inclusion. The parallel RLC structure provides a higher compactness of the reference sample as compared with a series RLC structure which would also be possible;

By adjusting the values of components, the resonance frequency and the amplitude of the apparent permeability measured by adjusting the values of the components may be varied. A modelling of the apparent permeability response of the inclusion is used with the following approximate formula:

$$\mu_{\it eff} = 1 - \alpha \frac{Z_b}{Z_b + Z_C}$$

with
$\mu_{\it eff}$: apparent permeability of the volume defined around the inclusion,
$\alpha$: actual filling coefficient,
$Z_b$: impedance of the inductive component for coupling with the driving field in the characterisation cell, $Z_c$: load impedance connected in parallel on the inductive component.

In the case of a parallel RLC circuit, the theoretical resonance frequency $F_{rth}$ of the obtained permeability is described by the following formula:

$$F_{rth} = \frac{1}{2\pi\sqrt{LC}}$$

wherein L and C are the values of the total parallel inductance and capacitance of the inclusion (in Henrys and Farads, respectively).

In this example, surface mounted components or SMCs may be connected together and transferred onto a glass wafer usually used as a substrate for characterised ferromagnetic films.

FIGS. 3, 4, 5A and 5B illustrate examples of permeances measured by single coil perturbation depending on the values of components used for making reference samples.

Figure 3:
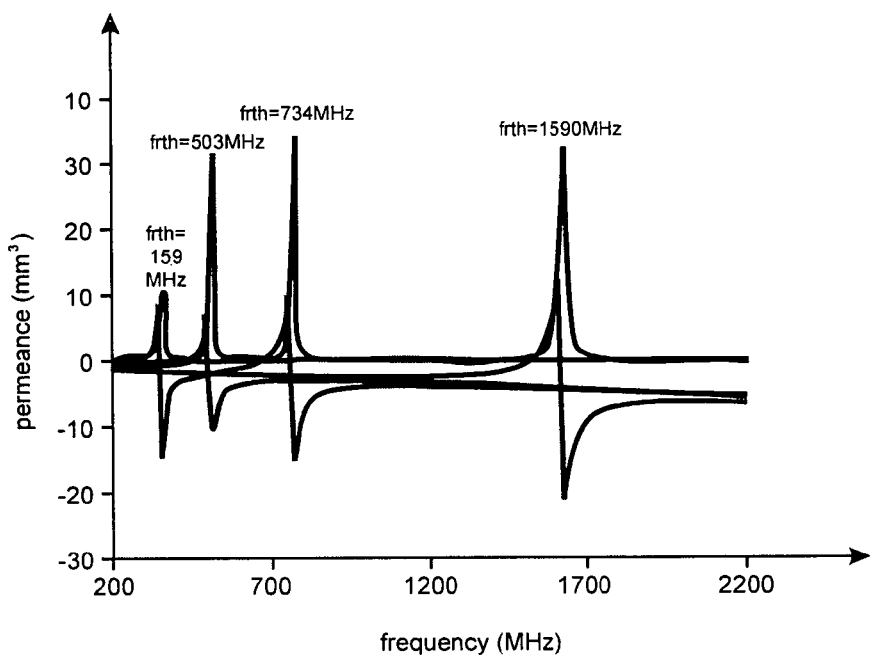
Figure 4:
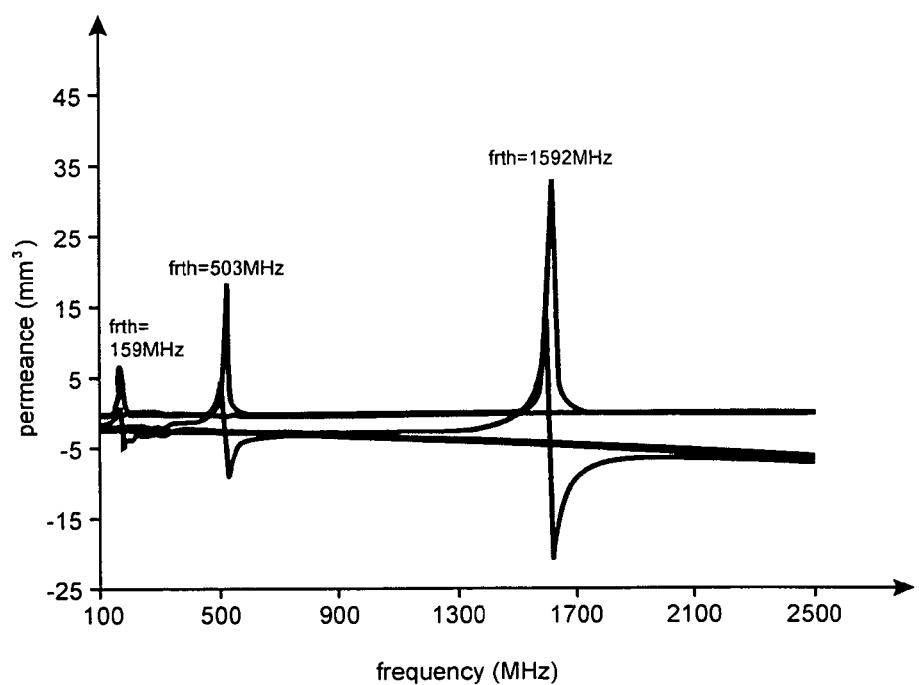

FIG. 3 illustrates permeance spectra obtained with these reference samples from three elements R, L and C in parallel such that:
C=1 pF
L=10 nH→220 nH
R=∞

FIGS. 5A and 5B illustrate permeance spectra obtained with reference samples from three elements R, L and C in parallel such that:
C=1 pF→100 pF
L=10 nH
R=∞

FIGS. 5A and 5B illustrate permeance spectra with a reference sample formed from three elements R, L, C in parallel, such that:
L=47 nH
C=1 pF
R=∞, 100 kΩ, 25 kΩ, 5 kΩ

In order to conduct a differential measurement, the two required measurements are carried out while ensuring rotation by 90° of a reference sample within the measuring cell.

Figure 6:
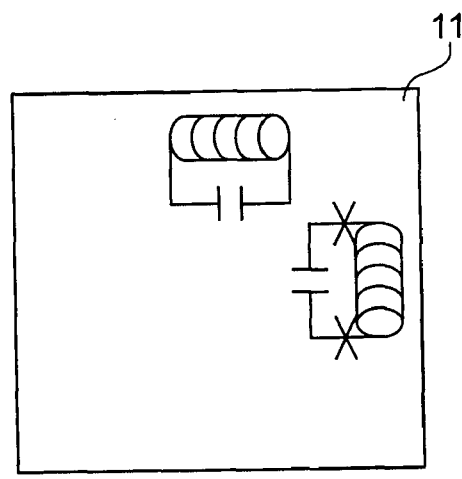
FIG. 6 illustrates the principle for making a reference magnetic sample with integrated dielectric reference.

FIG. 6 illustrates the principle for making the reference magnetic sample with an integrated dielectric reference. The crosses mark the connections which were not made between the components of the inclusion. One inclusion out of two does not have any permeability, even if its electric properties (permittivity) remain quite identical. Such a sample is called a bipolarised sample.

Figure 7A:
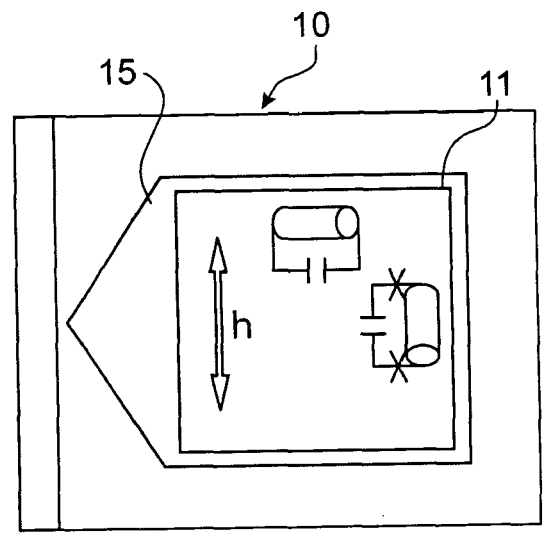
FIGS. 7A and 7B illustrate the position of a bipolarised sample in top views, respectively for the measurement on the dielectric portion and for the measurement of the reference permeability.
Figure 7B:
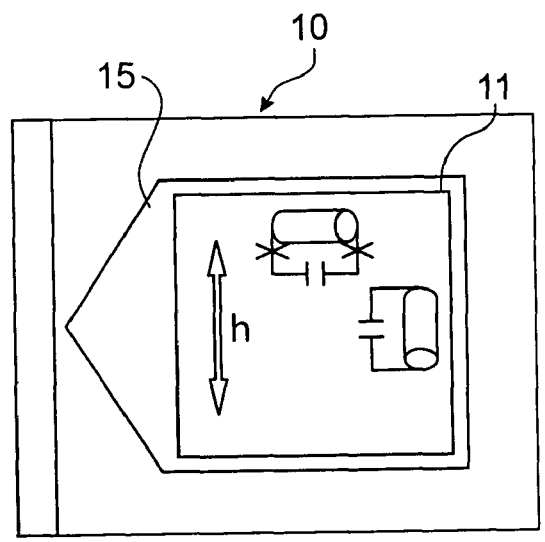

For measuring such a sample, one proceeds in two steps as illustrated in FIGS. 7A and 7B, while benefiting from the particular quasi-TEM geometry of the electromagnetic fields in the characterisation cell.

In FIG. 7A, the active inclusion (without the crosses) is not excited by the magnetic field h when the latter is perpendicular to the axis of the coil. The one which is excited by the magnetic field h does not have any permeability because the components are not connected. In this case only the dielectric effects are therefore measured.

In FIG. 7B, the active inclusion is excited by the magnetic field h (a field parallel to the axis of the coil); the inactive inclusion is not excited. In this case the effects of permittivity and permeability are therefore measured.

REFERENCES

[1] Article entitled: "An improved permeameter for thin films measurements up to 6 GHz" by D. Pain, M. Ledieu, O. Acher, A. L Adenot and F. Duverger (Journal of Applied Physics, Volume 85(8), 15 Apr. 1999, pages 5151-5153)

[2] Article entitled: "Cross measurements of thin film permeability up to UHF range" by M. Yamaguchi, O. Acher, Y. Miyazawa, K. I. Arai and M. Ledieu (Journal of Magnetism and Magnetic Materials, 242-245, 2002, pages 970-972).

The invention claimed is:

1. A method for measuring magnetic permeability of a magnetic material by measuring the magnetic interaction of an electromagnetic field with this material by using a measuring device including a measuring cell connected through a microwave frequency cable to a vector network analyser, said method comprising:
preliminary steps for gauging/calibrating said measuring device, determining corrective coefficients to be applied to the measurements obtained by means of this device, verifying the non-drift of this device, these steps being carried out with the help of a reference sample,
a step for measuring the permeability of the magnetic material,
wherein, during the preliminary steps, a reference sample is used, comprising at least one inclusion which enables creation, in a given volume, of a local artificial permeability, each inclusion being achieved by combining at least one inductive component associated with a combination of at least one capacitive and/or resistive and/or active component, the frequency response of the electromagnetic properties of each volume being adjusted by the value and the assembly architecture of the components, and in that the value of at least one component of at least one inclusion is remotely adjustable.

2. The method according to claim 1, wherein the reference sample includes at least one element containing a magnetic material.

3. The method according to claim 2, wherein at least one component comprises elements with an electric function.

4. The method according to claim 1, wherein the components of at least one inclusion are embedded in a dielectric filler material.

5. The method according to claim 1, wherein the whole of the inclusions is embedded in a dielectric filler material.

6. The method according to claim 1, for which the shape of the reference sample allows repeatable and easy positioning in a measuring cell.

7. The method according to claim 1, wherein the reference sample has a reference magnetic function in one electromagnetic field direction and a non-magnetic dielectric function in another direction.

8. A permeability reference sample capable of being used for:
steps for:
gauging/calibrating a device for measuring magnetic permeability of a magnetic material by measuring the magnetic interaction of an electromagnetic field with this material, this measuring device including a measuring cell connected through a microwave frequency cable to a vector network analyser,
determining corrective coefficients to be applied to the measurements obtained by means of this device,
verifying the non-drift of this device,
which comprises at least one inclusion which enables creation, in a given volume, of a local artificial permeability, each inclusion being achieved by combining at least one inductive component possibly associated with a combination of at least one capacitive and/or resistive and/or active component, the frequency response of the electromagnetic properties of each volume being adjusted by the value and the assembly architecture of the components, and in that the value of at least one component of at least one inclusion is remotely adjustable.

9. The sample according to claim 8, which includes at least one element containing a magnetic material.

10. The sample according to claim 8, wherein at least one component comprises elements with an electric function.

11. The sample according to claim 8, wherein the components of at least one inclusion are embedded in a dielectric filler material.

12. The sample according to any of claim 8, wherein the whole of the inclusions is embedded in a dielectric filler material.

13. The sample according to any of claim 8, the shape of which enables repeatable and easy positioning in a measuring cell.

14. The sample according to claim 8, which has a reference magnetic function in one electromagnetic field direction, and a non-magnetic dielectric function in another direction.

* * * * *